United States Patent [19]

Spellman

[11] 4,187,513
[45] Feb. 5, 1980

[54] SOLID STATE CURRENT LIMITER

[75] Inventor: Gordon B. Spellman, Mequon, Wis.
[73] Assignee: Eaton Corporation, Cleveland, Ohio
[21] Appl. No.: 855,933
[22] Filed: Nov. 30, 1977
[51] Int. Cl.² .................................... H01L 47/00
[52] U.S. Cl. ......................................... 357/1; 357/3;
                          357/56; 357/57; 357/61; 357/86
[58] Field of Search ................... 357/3, 22, 55, 56, 57,
                          357/61, 1, 86

[56] References Cited

U.S. PATENT DOCUMENTS

| | | | |
|---|---|---|---|
| 2,954,486 | 9/1960 | Daucette et al. | 357/22 |
| 3,516,017 | 6/1970 | Kaneko et al. | 357/3 |
| 3,689,993 | 9/1972 | Tolar | 357/3 |
| 3,852,794 | 12/1974 | Pearson et al. | 357/61 |
| 3,953,879 | 4/1976 | d'Arlach et al. | 357/56 |
| 4,134,122 | 1/1979 | Moutou et al. | 357/3 |

FOREIGN PATENT DOCUMENTS 2553701 8/1976 Fed. Rep. of Germany .............. 357/3

OTHER PUBLICATIONS

Mo et al. ". . . Field Effect Transistor with Field-Dependent Mobility," IEEE Trans. on Electron Devices, Aug. 1970, pp. 577–586.

Primary Examiner—William D. Larkins
Attorney, Agent, or Firm—Hugh R. Rather; William A. Autio

[57] ABSTRACT

A semiconductor device is disclosed which uses the phenomenon of "scattering limited velocity effect" for practical current limiting purposes. A monolithic chip of semiconductor material has a plurality of active spot regions or conduction channels formed by an encompassing inactive region which surrounds and separates each of the channels. The inactive region blocks current flow and performs a heat sinking function, the latter being necessary because of the high power density within the conduction channels at which the "scattering limited velocity effect" is exhibited.

14 Claims, 4 Drawing Figures

SOLID STATE CURRENT LIMITER

BACKGROUND OF THE INVENTION

The phenomenon of "scattering limited velocity effect" in semiconductor material is known. The present invention relates to a practical application thereof.

SUMMARY OF THE INVENTION

An object of the present invention is to provide a solid state current limiter which may be fabricated as a discrete component or may be integrated on a common substrate with other components.

Another object of the invention is to provide a current limiter of the aforementioned character integrating in a single chip both a plurality of high power density active spot regions and adequate heat sink means to enable utilization of the phenomenon of "scattering limited velocity effect" for current limiting purposes above a designated applied electric field without destructive thermal breakdown.

Another object of the invention is to provide a current limiter of the aforementioned character having a relatively simple structure with relatively large dimensions affording ease of processing, and also affording the use of standard processing techniques.

Other objects and advantages will hereinafter appear.

DESCRIPTION OF THE PREFERRED EMBODIMENT

The phenomenon of "scattering limited velocity effect" is present in all semiconductor material. At room temperature, free electrons (unbound electrons outside the outer shell of the atoms in the lattice) are randomly moving at high velocity. Application of an electric field across the semiconductor material changes the random velocity of the electrons and results in current flow.

The amount of current flow can be calculated by statistical distributions based on Newtonian mechanics of collisions between the electrons and the lattice. As the applied electric field increases, the velocity of the free electrons increases, and, assuming the distance between collisions remains constant, Ohm's law will still be valid, i.e. current (average velocity of free electrons) increases linearly with respect to the applied electric field.

Figure 1:
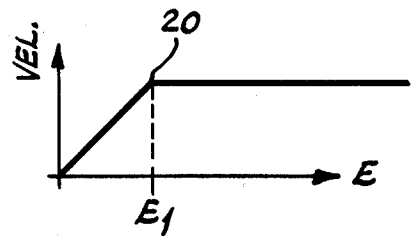
FIG. 1 is a graph of carrier velocity versus electric field.

At a certain value $E_1$ of the applied electric field, the velocity of the free electrons no longer increases but rather remains constant, as shown in FIG. 1. This is the phenomenon of "scattering limited velocity effect." Further increase of the field above $E_1$ does not increase the velocity of free electrons and hence does not increase the amount of current flow. Thus above $E_1$, the material does not obey Ohm's law.

This phenomenon is theoretically explained in terms of quantum mechanical wave motion. Below $E_1$, the electrons have energies corresponding to quantum mechanical waves of certain frequencies which have a high probability of colliding with atoms of a certain vibrational mode within the lattice to emit what is called an acoustical phonon. Above $E_1$, the electrons have higher energies corresponding to higher frequency quantum mechanical waves which have the additional probability of colliding with other atoms of a different vibrational mode within the lattice to emit what is called a optical phonon. It is the additional collisions which limit the average velocity of the electrons and the amount of current flow. Increasing the applied electric field above the value $E_1$ increases the probability of collision, and the increased number of collisions establishes an upper limit on the average velocity of the electrons in spite of the increased energy thereof.

Figure 2:
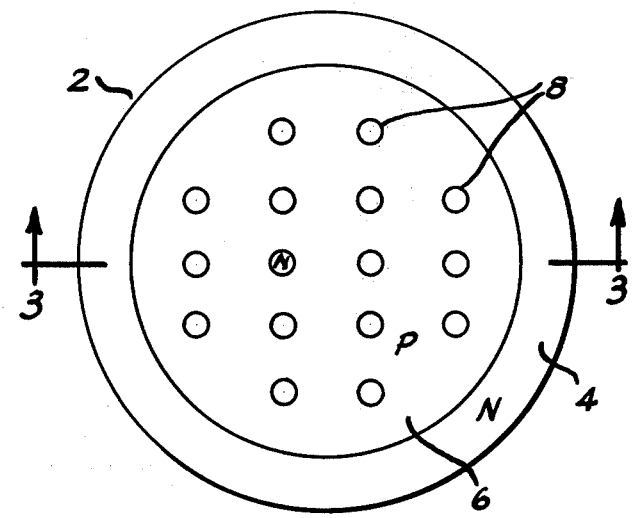
FIG. 2 is a top view, with metallization removed, of the preferred form of the present invention.
Figure 3:
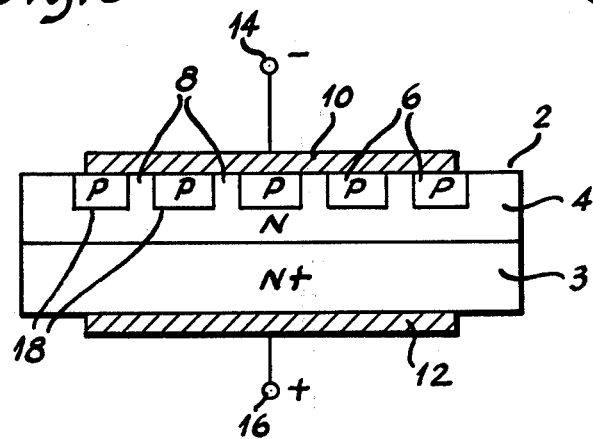
FIG. 3 is a cross-sectional view taken along line 3—3 of FIG. 3.

FIGS. 2 and 3 show the preferred form of a current limiter 2 constructed in accordance with the present invention enabling utilization of the phenomenon of "scattering limited velocity effect." An N+ type substrate 3 has an N type epitaxial layer 4 formed thereon. A perforated P type layer 6 is diffused into layer 4 to form a plurality of N type spot regions or channels 8. Metallizations 10 and 12 and terminals 14 and 16 are added for circuit connection.

A positive potential applied to terminal 16 with respect to terminal 14 causes current flow through channels 8. Blocking PN junctions 18 formed by the interface of layers 4 and 6 prevent current flow through layer 6. There are thus formed a plurality of active spots regions or conduction channels 8 separated and surrounded by an encompassing inactive region 6.

Application of an electric field greater than $E_1$ across terminals 16 and 14 results in extremely high current density in channels 8 which generate a high amount of heat that must be dissipated in order to avoid destructive thermal breakdown of the device. P type layer 6 acts as a heat sink to dissipate such heat. Instead of P type layer 6, simple dielectric isolation means could be used. Another variation would be the provision of a buried P layer, rather than surface P layer 6, to afford bipolar operation. Also, a P type substrate, rather than N type, may be used if desired because the "scattering limited velocity effect" is exhibited in P type material also.

The critical need is that of adequate heat dissipation. For example, if layer 6 were omitted from FIGS. 2 and 3, current would flow across the entire surface area of layers 3 and 4 of extremely high density for fields greater than $E_1$, and the device would burn out because the area is too great to provide adequate conventional heat sinks, such as add-on cooling fins, etc. If the surface area were reduced to the size of a single spot, for example, the amount of current flow is too small for practical applications.

The embodiment of FIGS. 2 and 3 provides sufficient area to enable a usable amount of current flow and also provides necessary heat sink means. The present invention thus enables both of these heretofore incompatible results, and does so in a single chip by integrating many high power density separated spots into a single structure. The power density in the channels is very high but the heat sinking action of layer 6 maintains the average power density along the surface at a moderate level whereby the device will not burn up. The cumulative current flow through the many channels provides a usable amount of current for practical applications.

A specific example will now be given. Using silicon semiconductor material, and for a reasonably high operating temperature, e.g. 200° C., the lowest level of doping that will make silicon an extrinsic semiconductor is about N (free electron density) = $10^{15}$ electrons/cm$^3$ One set of empirically determined values for velocity and electric field at point 20, FIG. 1, is E = $10^5$ volts/cm velocity $10^7$ cm/sec.

(Further reference may be had to Physics of Semiconductor Devices, S. M. Sze, John Wiley and Sons, Inc., 1969, pp. 56–59, especially FIG. 29, for other values of electric field and carrier velocity.)

Given the above values, the following calculation can be made:

power density = $E$(volts/cm) × $I$ (amps/cm$^2$)
= $E$(volts/cm) × $N$ (electron/cm$^3$) × $q_0$(coulombs/electron) × vel (cm/sec)
= $10^5$ volts/cm × $10^{15}$ electrons/cm$^3$ × 1.6 × $10^{-19}$ coulombs/electron × $10^7$ cm/sec
= 1.6 × $10^8$ watts/cm$^3$.

In one particular embodiment for use in 30 volt DC aircraft power systems, a 3 micron thick layer was used. Given a spot area of $10^{-4}$ cm$^2$, the following calculation can be made:

single spot power = power density (watts/cm$^3$) × spot area (cm$^2$) × spot thickness (cm)
= 1.6 × $10^8$ watts/cm$^3$ × $10^{-4}$ cm$^2$ × 3 × $10^{-4}$ cm
= 4.8 watts/spot.

A known device which operates at similar high power densities as the present invention is an impatt (impact-avalanche transit-time) diode. An impatt diode having an area of $10^{-4}$ cm$^2$ can dissipate about 10 watts with a 200° C. temperature rise. (Further reference may be had to Sze reference, pp. 256–257, especially FIG. 36). Based on the above calculation of 4.8 watts/spot, the specifically disclosed example of the current limiter will exhibit a 100° C. spot temperature rise.

The above method of calculating local hot spot temperature is valid as long as the spots are placed at least several diameters apart. While not a limitation of the invention, such spacing is preferred, especially for high current ratings. In the specific example disclosed, the device limits current to 30 amps for 0.3 seconds at 30 volts (across terminals 16 and 14), and carries 10 amps for an unlimited period of time at 1 volt. In general, the spacing of the spots in the design of the current limiter is determined by the power and time requirements placed thereon. Wider spacing of the spots increases the length of time during which current is limited. Sufficiently wide spacing of the spots affords continuous limiting of the current.

Figure 4:
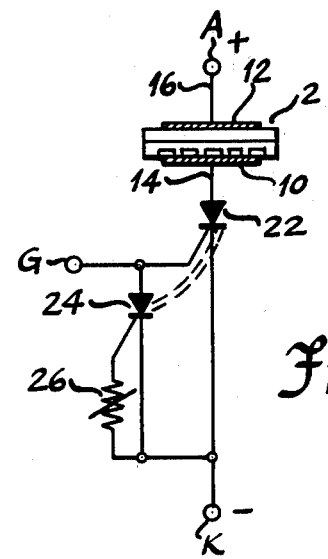
FIG. 4 is a circuit diagram showing one of many advantageous uses of the current limiter of FIGS. 2 and 3.

A particularly useful application of the present invention is shown in FIG. 4. A power thyristor 22 having anode A and cathode K is provided for connection across a load (not shown) to control current thereto. A gate terminal G is provided for applying a triggering signal to fire thyristor 22 into conduction. A thermally sensitive thyristor 24 is electrically connected between G and K so as to be in parallel with the gate of the power thyristor 22. Tyristor 24 responds to a predetermined temperature by intrinsically switching states and may be like those disclosed in U.S. Pat. No. 3,971,056 or in U.S. patent application Ser. No. 652,192, filed Jan. 26, 1976. As taught in U.S. Pat. No. 4,050,083, thyristors 22 and 24 may be integrated in a single chip, the common substrate thermally coupling the two thyristors. Thyristors 22 and 24 may also be discrete components with thermal coupling means therebetween. Thyristor 24 senses the temperature of thyristor 22 and responds to a predetermined value thereof by intrinsically switching to its conductive state whereby to shunt gate current therethrough and away from the gate of thyristor 22. Variable resistor 26 adjusts the switching temperature of thyristor 24. The arrangement is thus a thermally self-protected power switching device since thyristor 24 automatically shunts gate current above a predetermined temperature of power thyristor 22.

When thyristor 24 shunts gate current away from thyristor 22, the latter will still remain conductive until the current flowing therethrough drops below its holding current. For example, if an alternating power source is applied across A and K, thyristor 22 will remain conductive until the end of the cycle when the applied voltage passes through zero or drops below some holding value; and thyristor 22 will not turn on in the next cycle. There is thus an unprotected fractional cycle portion.

The current limiter 2 may be connected in series with the power thyristor 22 to afford protection during the fractional remainder of the cycle by limiting the amount of current flow. Current limiter 2 need only limit the current for a period of time equal to the remainder of a single period of cycle of the power supply because thyristor 22 will remain off during subsequent cycles. For example with a 60 hertz A.C. source, the maximum length of time for which current must be limited is one-half cycle, or 0.008 sec. Current ratings of thyristor 22 determines values to which current must be limited by current limiter 2. The present invention in combination with the arrangement in FIG. 4 thus affords complete protection of thyristor 22, with no unprotected fractional cycle portion during which short-circuit, etc. current surges could otherwise damage thyristor 22 and/or a load thereacross.

An important feature of the present invention is its ease of integration, either as a single component or with other components. Though not limited thereto, the current limiter of the present invention is preferredly fabricated by using diffusion techniques because of the relatively simple structure requiring few diffusions. The epitaxial construction is preferred because it affords a uniform and high resistance in the active power dissipating spot. The diffusions are shallow and thus the diffusion times are short. Relatively large dimensions are involved, thus affording easy processing. Furthermore, standard processing techniques may be used.

The current limiter 2, FIG. 4, may be formed on the same chip with thyristors 22 and 24. The current limiter can be fabricated with many other integrated circuits for protective purposes, or may be used discretely as a single movement.

Another feature of the present invention is that since the "scattering limited velocity effect" is not dependent upon minority carrier lifetime, a broad range of materials and structures are possible. For example, multiple spots of GaAs (gallium arsenide) may be deposited onto a silicon wafer resulting in a lower voltage field threshold for current limiting than achievable with silicon.

Another example would be GaAsP (gallium arsenide phosphide).

I claim:

1. A solid state current limiter comprising a substrate of semiconductor material having a plurality of active spot regions each of a diameter within an order of magnitude of 100 microns formed therein separated by an inactive region, said active spot regions having a total cumulative area of at least 0.002 square centimeters, said active spot regions forming conduction channels through which a limited amount of current flows upon application across said substrate of an electric field above a predetermined magnitude, said inactive region serving a block current flow therethrough and to act as a heat sink around each of said active spot regions.

2. The current limiter according to claim 1 wherein the amount of current flow through said conduction channels increases with increasing magnitudes of applied electric field across said substrate until said predetermined magnitude is reached, whereafter the amount of current flow through said conduction channels is limited by scattering limited velocity effect, said conduction channels remaining open with no field effect pinch-off thereof.

3. The current limiter according to claim 2 wherein said active spot regions are lightly doped such that the effect of carrier-lattice collisions is significant.

4. The current limiter according to claim 3 wherein said substrate is of one conductivity type and wherein said inactive region comprises a perforated layer in said substrate, said conduction channels being portions of said substrate extending through the perforations in said layer.

5. The current limiter according to claim 4 wherein said perforated layer is of opposite conductivity type.

6. The current limiter according to claim 5 wherein said perforated layer is formed on a facing surface of said substrate whereby said active spot regions are on said facing surface and are surrounded and separated by said inactive region, the junction between said layer and said substrate blocking one direction of current flow through said layer.

7. The current limiter according to claim 6 wherein said layer is formed in said substrate by a single diffusion.

8. The current limiter according to claim 5 wherein said layer is buried in said substrate whereby to afford bipolar operation of said current limiter.

9. The current limiter according to claim 4 wherein said perforated layer comprises dielectric material.

10. The current limiter according to claim 1 wherein said active spot regions are spaced at least one diameter apart whereby the average power density along said current limiter is maintained at a moderate level by the heat sinking action of said inactive region despite the localized high power density at said active spot regions, whereby there is afforded in a single chip adequate heat sink means and a usable amount of current flow for practical applications.

11. A solid state current limiter comprising a substrate of semiconductor material of one conductivity type having at least 20 active spot regions of said one conductivity type each of a diameter of at least 100 microns formed therein separated by an inactive region of opposite conductivity type, said active spot regions forming conduction channels through which a limited amount of current flows upon application across said substrate of an electric field above a predetermined magnitude, the width of each said active spot region being greater than the maximum width of the depletion zones induced thereby by high values of said applied electric field to thus maintain a finite channel width and prevent field effect pinch-off thereof, said inactive region serving to block current flow therethrough and to act as a heat sink around each of said active spot regions.

12. A solid state current limiter comprising a substrate of semiconductor material having greater than about 100 active spot regions each of a width greater than about 50 microns formed therein separated by an inactive region, said active spot regions forming conduction channels through which a limited amount of current flows upon application across said substrate of an electric field above a predetermined magnitude said inactive region serving to block current flow therethrough and to act as a heat sink around each of said active spot regions.

13. The invention according to claim 12 wherein said current limiter has greater than about 200 said active spot regions each of a width greater than about 100 microns.

14. A solid state current limiter comprising a substrate of semiconductor material having at least 20 active spot regions each of a diameter of at least 100 microns formed therein separated by an inactive dielectric region, said active spot regions forming conduction channels through which a limited amount of current flows upon application across said substrate of an electric field above a predetermined magnitude, said dielectric region minimizing the formation of depletion zones in said active spot regions even at high values of said applied electric field thus maintaining conduction channel widths substantially equal to active spot widths whereby to prevent field effect pinch-off thereof, said inactive dielectric region serving to block current flow therethrough and to act as a heat sink around each of said active spot regions.

* * * * *